(12) United States Patent
Shul et al.

(10) Patent No.: US 7,105,098 B1
(45) Date of Patent: Sep. 12, 2006

(54) METHOD TO CONTROL ARTIFACTS OF MICROSTRUCTURAL FABRICATION

(75) Inventors: Randy J. Shul, Albuquerque, NM (US); Christi G. Willison, Albuquerque, NM (US); W. Kent Schubert, Albuquerque, NM (US); Ronald P. Manginell, Albuquerque, NM (US); Mary-Anne Mitchell, Edgewood, NM (US); Paul C. Galambos, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 560 days.

(21) Appl. No.: 10/165,356

(22) Filed: Jun. 6, 2002

(51) Int. Cl.
B44C 1/22 (2006.01)

(52) U.S. Cl. .................. 216/41; 216/46; 216/59; 216/51

(58) Field of Classification Search .............. 216/2, 216/41, 46, 49, 51
See application file for complete search history.

(56) References Cited

U.S. PATENT DOCUMENTS

| | | | |
|---|---|---|---|
| 749,633 A | 1/1904 | Steeley | |
| 2,178,931 A | 11/1939 | Crites et al. | |
| 2,197,392 A | 4/1940 | Hawthorn | |
| 2,249,769 A | 7/1941 | Leonardon | |
| 2,301,783 A | 11/1942 | Lee | |
| 2,354,887 A | 8/1944 | Silverman et al. | |
| 2,379,800 A | 7/1945 | Hare | |
| 2,414,719 A | 1/1947 | Cloud | |
| 2,531,120 A | 11/1950 | Feaster | |
| 2,633,414 A | 3/1953 | Boivinet | |
| 2,659,773 A | 11/1953 | Barney | |
| 2,662,123 A | 12/1953 | Koenig, Jr. | |
| 2,748,358 A | 5/1956 | Johnston | |
| 2,974,303 A | 3/1961 | Dixon | |
| 2,982,360 A | 5/1961 | Morton et al. | |
| 3,079,549 A | 2/1963 | Martin | |
| 3,090,031 A | 5/1963 | Lord | |
| 3,170,137 A | 2/1965 | Brandt | |
| 3,186,222 A | 6/1965 | Martin | |
| 3,194,886 A | 7/1965 | Mason | |
| 3,209,323 A | 9/1965 | Grossman, Jr. | |
| 3,227,973 A | 1/1966 | Gray | |
| 3,253,245 A | 5/1966 | Brandt | |
| 3,518,608 A | 6/1970 | Papadopoulos | |
| 3,696,332 A | 10/1972 | Dickson, Jr. et al. | |
| 3,793,632 A | 2/1974 | Still | |
| 3,807,502 A | 4/1974 | Heilhecker et al. | |
| 3,879,097 A | 4/1975 | Oertle | |
| 3,930,220 A | 12/1975 | Shawhan | |
| 3,957,118 A | 5/1976 | Barry et al. | |
| 3,989,330 A | 11/1976 | Cullen et al. | |
| 4,012,092 A | 3/1977 | Godbey | |
| 4,087,781 A | 5/1978 | Grossi et al. | |
| 4,095,865 A | 6/1978 | Denison et al. | |
| 4,121,193 A | 10/1978 | Denison | |
| 4,126,848 A | 11/1978 | Denison | |
| 4,215,426 A | 7/1980 | Klatt | |
| 4,220,381 A | 9/1980 | van der Graaf | |
| 4,348,672 A | 9/1982 | Givler | |

(Continued)

Primary Examiner—Nadine Norton
Assistant Examiner—Binh X. Tran
(74) Attorney, Agent, or Firm—Kevin W. Bieg

(57) ABSTRACT

New methods for fabrication of silicon microstructures have been developed. In these methods, an etching delay layer is deposited and patterned so as to provide differential control on the depth of features being etched into a substrate material. Compensation for etching-related structural artifacts can be accomplished by proper use of such an etching delay layer.

6 Claims, 3 Drawing Sheets

U.S. PATENT DOCUMENTS

| | | |
|---|---|---|
| 4,445,734 A | 5/1984 | Cunningham |
| 4,496,203 A | 1/1985 | Meadows |
| 4,537,457 A | 8/1985 | Davis, Jr. et al. |
| 4,578,675 A | 3/1986 | Macleod |
| 4,605,268 A | 8/1986 | Meador |
| 4,660,910 A | 4/1987 | Sharp et al. |
| 4,683,944 A | 8/1987 | Curlett |
| 4,698,631 A | 10/1987 | Kelly, Jr. et al. |
| 4,722,402 A | 2/1988 | Weldon |
| 4,785,247 A | 11/1988 | Meador et al. |
| 4,788,544 A | 11/1988 | Howard |
| 4,806,928 A | 2/1989 | Veneruso |
| 4,884,071 A | 11/1989 | Howard |
| 4,901,069 A | 2/1990 | Veneruso |
| 4,914,433 A | 4/1990 | Galle |
| 4,924,949 A | 5/1990 | Curlett |
| 5,008,664 A | 4/1991 | More et al. |
| 5,052,941 A | 10/1991 | Hernandez-Marti et al. |
| 5,148,408 A | 9/1992 | Matthews |
| 5,248,857 A | 9/1993 | Ollivier |
| 5,278,550 A | 1/1994 | Rhein-Knudsen et al. |
| 5,302,138 A | 4/1994 | Shields |
| 5,311,661 A | 5/1994 | Zifferer |
| 5,332,049 A | 7/1994 | Tew |
| 5,334,801 A | 8/1994 | Mohn |
| 5,371,496 A | 12/1994 | Tanamachi |
| 5,454,605 A | 10/1995 | Mott |
| 5,455,573 A | 10/1995 | Delatorre |
| 5,505,502 A | 4/1996 | Smith et al. |
| 5,517,843 A | 5/1996 | Winship |
| 5,521,592 A | 5/1996 | Veneruso |
| 5,568,448 A | 10/1996 | Tanigushi et al. |
| 5,650,983 A | 7/1997 | Kondo et al. |
| 5,691,712 A | 11/1997 | Meek et al. |
| 5,743,301 A | 4/1998 | Winship |
| RE35,790 E | 5/1998 | Pustanyk et al. |
| 5,810,401 A | 9/1998 | Mosing et al. |
| 5,833,490 A | 11/1998 | Bouldin |
| 5,853,199 A | 12/1998 | Wilson |
| 5,856,710 A | 1/1999 | Baughman et al. |
| 5,898,408 A | 4/1999 | Du |
| 5,908,212 A | 6/1999 | Smith et al. |
| 5,924,499 A | 7/1999 | Birchak et al. |
| 5,942,990 A | 8/1999 | Smith et al. |
| 5,955,966 A | 9/1999 | Jeffryes et al. |
| 5,959,547 A | 9/1999 | Tubel et al. |
| 5,971,072 A | 10/1999 | Huber et al. |
| 6,030,004 A | 2/2000 | Schock et al. |
| 6,041,872 A | 3/2000 | Holcomb |
| 6,045,165 A | 4/2000 | Sugino et al. |
| 6,046,685 A | 4/2000 | Tubel |
| 6,057,784 A | 5/2000 | Schaaf et al. |
| 6,104,707 A | 8/2000 | Abraham |
| 6,108,268 A | 8/2000 | Moss |
| 6,123,561 A | 9/2000 | Turner et al. |
| 6,141,763 A | 10/2000 | Smith et al. |
| 6,173,334 B1 | 1/2001 | Matsuzaki et al. |
| 6,177,882 B1 | 1/2001 | Ringgenberg et al. |
| 6,188,223 B1 | 2/2001 | Van Steenwyk et al. |
| 6,196,335 B1 | 3/2001 | Rodney |
| 6,209,632 B1 | 4/2001 | Holbert et al. |
| 6,223,826 B1 | 5/2001 | Chau et al. |
| 6,291,357 B1 * | 9/2001 | Zhang et al. ............... 438/714 |
| 6,367,565 B1 | 4/2002 | Hall |
| 6,392,317 B1 | 5/2002 | Hall et al. |
| 6,405,795 B1 | 6/2002 | Holbert et al. |
| 6,641,434 B1 | 11/2003 | Boyle et al. |
| 6,655,464 B1 | 12/2003 | Chau et al. |
| 6,670,880 B1 | 12/2003 | Hall et al. |
| 6,703,132 B1 * | 3/2004 | Yasuda et al. ............... 428/447 |
| 2002/0135179 A1 | 9/2002 | Boyle et al. |
| 2002/0193004 A1 | 12/2002 | Boyle et al. |
| 2003/0070842 A1 | 4/2003 | Bailey et al. |
| 2003/0213598 A1 | 11/2003 | Hughes |

* cited by examiner

METHOD TO CONTROL ARTIFACTS OF MICROSTRUCTURAL FABRICATION

GOVERNMENT RIGHTS

This invention was made with Government support under Contract DE-AC04-94AL85000 awarded by the U.S. Department of Energy. The Government has certain rights in the invention.

FIELD OF THE INVENTION

The present invention relates generally to silicon-based microstructure fabrication, and in particular to the use of etching delay layers to control artifacts arising in fabrication of silicon-based microstructures.

BACKGROUND OF THE INVENTION

Development of new fabrication technologies for silicon-based microstructures is currently under aggressive pursuit. Silicon-based microstructures commonly comprise silicon and silicon oxides, but can also comprise silicon nitride, metal thin films, and a range of other structural materials known in the art. Such microstructures are commonly fabricated using a range of techniques originally developed for fabrication of silicon integrated circuits, and find application in the area of microelectromechanical systems (MEMS), and in microfluidic systems, such as micro-scale chemical sensors, gas chromatographs, and the like.

It is held desirable in the art to fabricate a desired microstructure so that the number of gross assembly steps is limited. Gross assembly steps are those which provide external functional interconnection between individually fabricated subassemblies. Gross assembly steps require precision handling, positioning, and bonding of delicate millimeter-scale structures, which are fraught with opportunities for failure. In particular, when the goal is a micromechanical device, the bonding materials can easily interfere with the desired motion of the components of the device. Similarly, when the goal is a microfluidic device, the bonding materials can block the flow channels, or prevent microvalves from functioning properly.

Working against the above motivations for direct fabrication of complex microstructures is the difficulty of fabricating such microstructures in their entirety. As the complexity of a process required for fabrication of a desired silicon microstructure increases, the useful yield of that process falls rapidly toward zero. Complex fabrication processes are not only susceptible to error, but in many cases can lead to accumulation of residual stress, nonplanarity, and other structural flaws which can render the desired product unusable.

The etching of features into a silicon-based microstructure plays a central role in the fabrication of micro-scale silicon-based devices. Both wet etching and dry etching are commonly used in such fabrication. Wet etching of silicon is commonly carried out using liquid etchants including, but not limited to, KOH, tetramethyl ammonium hydroxide, or ethylene diamine pyrochatechol. In contrast, dry etching generally comprises the application of reactive neutrals and ionic etchants generated in a plasma to the surface to be etched. Of particular utility in silicon-based microstructural fabrication is deep reactive ion etching.

Both wet and dry etching procedures exhibit an effect called aspect-ratio-dependent etching, in which a narrow feature being defined by etching deepens less rapidly than does a wide feature being defined under the same etching conditions. In other words, the etching rate varies with the size of the feature being defined. Aspect-ratio-dependent etching effects can result in the need to define and etch narrow features separately from wider features, resulting in an undesirable increase in the complexity of the overall fabrication process.

There is an ongoing need in the art for microstructural fabrication techniques which allow the development of less complex fabrication processes.

The present invention addresses this need by enabling increased control over the definition by etching of structural features having widely different pattern widths.

These and other advantages of the method of the present invention will become evident to those skilled in the art.

SUMMARY OF THE INVENTION

New methods for fabrication of silicon-based microstructures have been developed. These methods comprise the deposition and patterning of an etching delay layer, whose presence modifies an etching step so as to more precisely control the end product thereof.

BRIEF DESCRIPTION OF THE DRAWINGS

FIG. 1 shows a schematic illustration of various structures produced during the use of the present invention to compensate for aspect-ratio-dependent etching.

FIG. 2 illustrates an artifact resulting from reactive ion etching of a deep well into a substrate.

FIG. 3 illustrates stages in the formation of a square-bottomed well in a substrate according to the present invention.

DETAILED DESCRIPTION

FIG. 1 illustrates the use of an etching delay layer in the fabrication of microstructures having features with a range of pattern shapes. Specifically, FIG. 1a shows the target microstructure. A narrow groove 101 and a wide groove 102 are to be fabricated in a substrate 100. Grooves 101 and 102 are to have the same nominal depth below the original surface of the substrate.

Figure 1A:
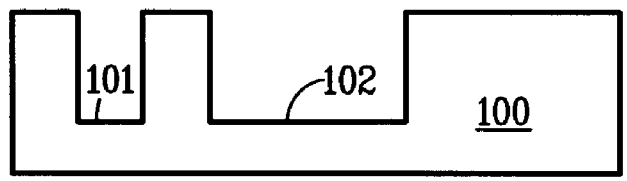
FIG. 1a shows a cross-sectional view of the desired microcomponent.
Figure 1B:
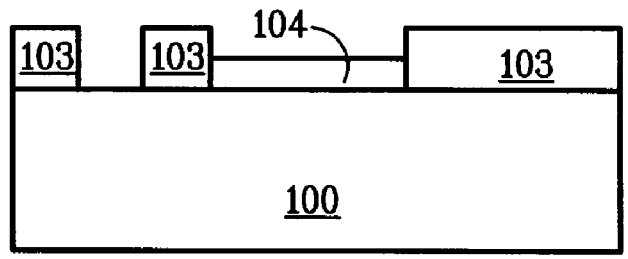
FIG. 1b shows a mask layer and an etching delay layer on a substrate from which the desired microcomponent is to be fabricated.

FIG. 1b shows the structure immediately prior to the start of the etching process. Mask layer 103 is deposited atop substrate 100. Mask layer 103 can be either a conventional photoresist layer or a thin film hard mask (metal or dielectric) layer, and is patterned so as to define etching windows for narrow groove 101 and wide groove 102.

Etching delay layer 104 is deposited on substrate 100 within the etching window for wide groove 102. Delay of the etching process in this region is required to obtain the desired structure of FIG. 1a, because wide features etch more rapidly to a given depth than do narrow features. The thickness $d_d$ of the etching delay layer required to obtain the desired structure is given by the relation $$d_d = r_d[(d_n/r_n) - (d_w/r_w)],$$

where $d_n$ is the desired depth of narrow groove 101, $d_w$ is the desired depth of wide groove 102, and $r_n$, $r_w$, and $r_d$ are the etching rates of the narrow groove, the wide groove, and the etching delay layer respectively. The example of FIG. 1 is chosen so that $d_n$ and $d_w$ are equal, but this is not necessary to use the present method, which can thus simultaneously enable fabrication of a multi-level surface and compensate for aspect-ratio-dependent etching effects.

Figure 1C:
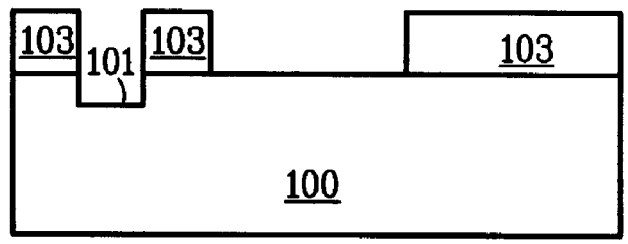
FIG. 1c shows a structure during the early stages of etching, at the moment when the etching delay layer has been removed.

FIG. 1c shows an intermediate structure reached in the early stages of etching. Narrow groove 101 is well begun, while etching delay layer 104 has just been etched away or intentionally removed, so that the formation of wide groove 102 is just beginning. The depth of the narrow groove at this point is just sufficient to compensate for the smaller etching rate of narrow features.

Figure 1D:
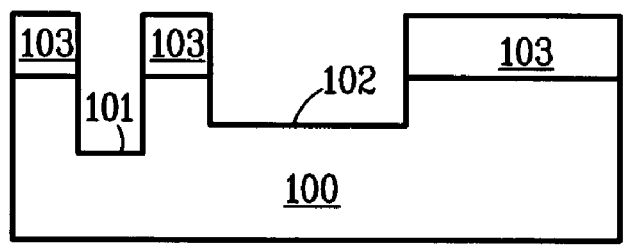
FIG. 1d shows a structure later during the etching process, when the depth of the wide groove is catching up with the depth of the narrow groove.

FIG. 1d shows an intermediate structure reached near the end of the etching process. Although narrow groove 101 is still deeper than is wide groove 102, the difference in depth is less than that of FIG. 1c. The larger etch rate of the wide groove relative to that of the narrow groove is narrowing the difference in depth of the two grooves.

Figure 1E:
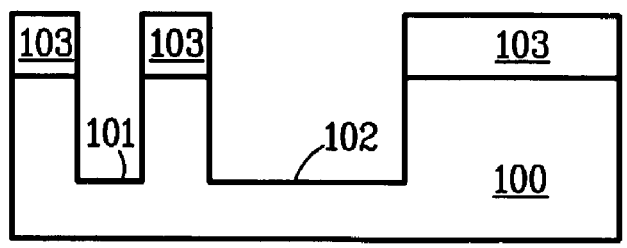
FIG. 1e shows attainment of the desired structure after subsequent etching.

FIG. 1e shows the fabrication of the desired component at the end of the etching process. As desired, the depths of the two grooves is equal. Use of the etching delay layer enabled features with different etching rates to be fabricated to equal depths in a substrate using a single etching process.

Figure 2A:
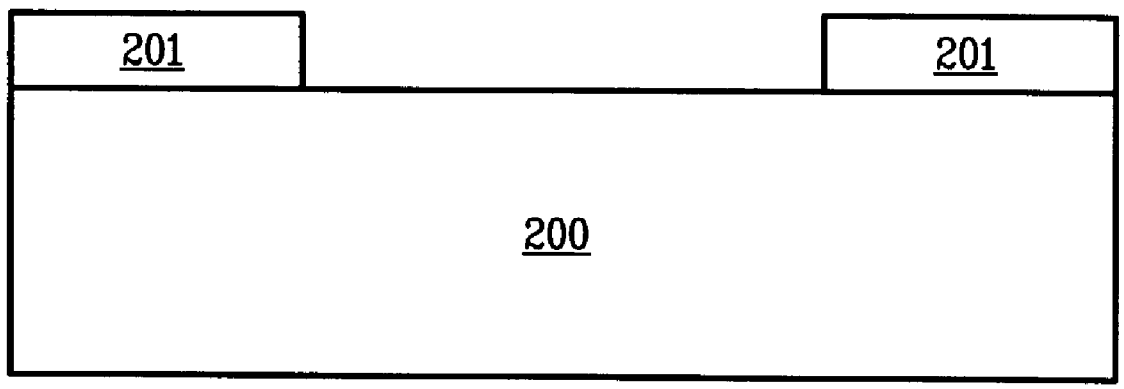
FIG. 2a shows the initial mask pattern on the surface of the substrate.
Figure 2B:
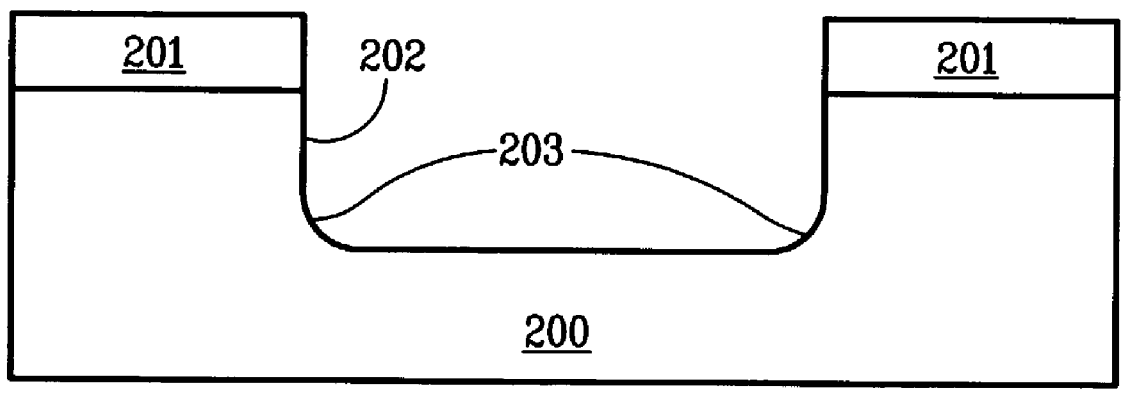
FIG. 2b shows the well which forms from an etching process, and the gradual transition from the walls of the well to the bottom of the well.

Another type of etching artifact can be ameliorated by use of an etching delay layer. FIG. 2 shows the formation of a large well 202 in a substrate 200 by a reactive ion etching process. The outline of well 202 is defined by resist layer 201, as shown in FIG. 2a. FIG. 2b shows the result of etching well 202 in substrate 200. Although the desired cross-sectional shape of well 202 is rectangular, the actual shape exhibits gradual transitions 203 between the vertical walls of well 202 and the flat bottom of well 202. This is an artifact of the etching process, resulting from ions scattering away from the vertical walls of well 202 as the etching process is carried out. As a result, less etching takes place immediately adjacent to said wall, and gradual transitions 203 form.

The abovedescribed etching artifact can be largely prevented, and the desired cross-sectional shape formed, with the use of an etching delay layer, as shown in FIG. 3. FIG. 3a shows the initial configuration of the substrate to be etched immediately prior to the etching process. Here the desired shape of the well to be formed in substrate 300 is defined by mask layer 301. Mask layer 301 can comprise a metallic, dielectric, or organic layer which is sufficiently resistant to the effects of the etching process that it defines the desired shape of the well throughout the etching process step.

Figure 3A:
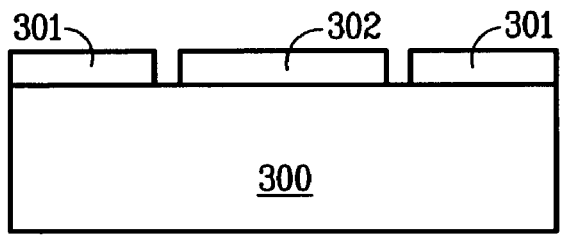
FIG. 3a shows the initial substrate masked for etching with a mask layer and an etching delay layer.

Etching delay layer 302 is formed and patterned within the shape defined by mask layer 301, as shown in FIG. 3a. A gap is left between etching delay layer 302 and mask layer 301, such that the size of the gap along the substrate surface is similar to, and typically a bit less than, the expected width of the gradual transition which would result from etching the desired well in the absence of etching delay layer 302. The purpose of this gap is to etch more deeply the region where the gradual transition would otherwise form, thereby attaining a substantially flat bottom for the well.

Figure 3B:
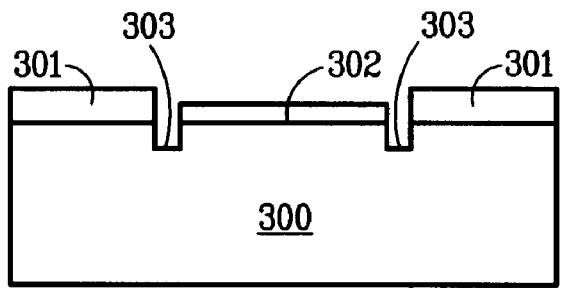
FIG. 3b shows the structure early in the etching process.

FIG. 3b shows the structure attained early in the etching process. Here transition wells 303 have been formed around the edge of etching delay layer 302, which itself has been partially removed by the etching process.

Figure 3C:
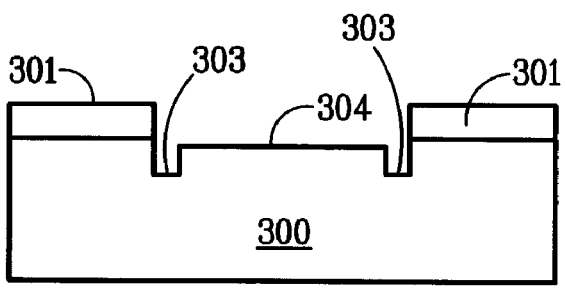
FIG. 3c shows the structure after the etching delay layer has been removed.

FIG. 3c shows the structure attained a bit later in the etching process. Here the transition wells 303 have been etched to a sufficient depth, and etching delay layer 302 has been removed, so that the well center surface 304 will deepen with continued etching.

Note that this process can be carried out with removal of etching delay layer 302 resulting solely from the substrate etching procedure, or alternately etching delay layer 302 can be removed by a separate etching or solvent step when the depth of transition wells 303 reaches their design value. In a particularly useful implementation, mask layer 301 will consist substantially of a hard-baked photoresist, and etching delay layer 302 will consist substantially of a non-hard-baked photoresist. When etching delay layer 302 is to be removed, application of a suitable solvent will remove layer 302, while substantially not removing mask layer 301.

Figure 3D:
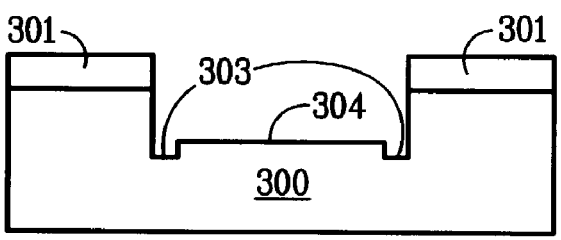
FIG. 3d shows the structure when the depth of the center of the well is nearly as deep as the depth at the edge of the well.
Figure 3E:
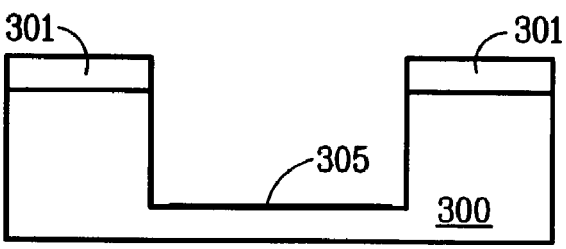
FIG. 3e shows the final structure of a square-bottomed well in the substrate.

The etching process continues, resulting in the penultimate structure shown in FIG. 3d. Here the more rapid etching rate of well center surface 304 has put that surface nearly at the same depth as that of the transition wells 303. In FIG. 3e, the well center surface and the bottoms of the transition wells have the same nominal depth, resulting in formation of the desired flat-bottomed well 305.

The specific implementations of the present invention described above are intended only to illustrate various features of the present invention. The scope of the present invention is intended to be set by the claims in view of the specification.

The invention claimed is:

1. A method for fabrication of silicon-based microstructures, comprising the deposition and patterning of an etching delay layer, and further comprising an etching process, the thickness and location of said etching delay layer being chosen to compensate for aspect-ratio-dependent etching effects.

2. The method of claim 1, wherein said etching delay layer comprises an inorganic thin film.

3. The method of claim 1, wherein said etching delay layer comprises an organic thin film.

4. The method of claim 3, wherein said organic thin film comprises a polymer.

5. A method for fabrication of silicon-based microstructures, comprising the deposition and patterning of an etching delay layer and the deposition and patterning of a mask layer, the size, shape, and position of the etching delay layer relative to the mask layer being in such a way as to substantially avoid etching artifacts.

6. The method of claim 5, wherein the mask layer comprises a hard-baked photoresist, the etching delay layer comprises a photoresist, and the etching delay layer is removed by application of a solvent to which the mask layer is substantially insoluble.

* * * * *